United States Patent
Ekbote et al.

(10) Patent No.: US 8,304,372 B2
(45) Date of Patent: Nov. 6, 2012

(54) PROCESS FOR JOINING OXIDE SUPERCONDUCTING TUBES WITH A SUPERCONDUCTING JOINT

(75) Inventors: Shrikant Narayan Ekbote, New Delhi (IN); Gursharan Kaur Padam, New Delhi (IN); Narendra Kumar Arora, New Delhi (IN); Mukul Sharma, New Delhi (IN); Ramesh Sethi, New Delhi (IN)

(73) Assignee: Council of Scientific and Industrial Research, New Delhi (IN)

( * ) Notice: Subject to any disclaimer, the term of this patent is extended or adjusted under 35 U.S.C. 154(b) by 648 days.

(21) Appl. No.: 12/525,026

(22) PCT Filed: Dec. 31, 2007

(86) PCT No.: PCT/IN2007/000616
§ 371 (c)(1),
(2), (4) Date: Jul. 29, 2009

(87) PCT Pub. No.: WO2008/093354
PCT Pub. Date: Aug. 7, 2008

(65) Prior Publication Data
US 2010/0009855 A1 Jan. 14, 2010

(30) Foreign Application Priority Data
Jan. 31, 2007 (IN) .............. 198/DEL/2007

(51) Int. Cl.
*H01L 39/24* (2006.01)
*H01L 39/02* (2006.01)
*H01R 4/00* (2006.01)

(52) U.S. Cl. ........ 505/470; 505/220; 505/706; 505/121; 427/62; 419/62

(58) Field of Classification Search .......... 505/441, 505/220, 430, 470, 705, 706; 427/62; 174/125.1
See application file for complete search history.

(56) References Cited

U.S. PATENT DOCUMENTS

| | | | | |
|---|---|---|---|---|
| 6,194,226 | B1* | 2/2001 | Sato et al. | 438/2 |
| 7,722,918 | B2* | 5/2010 | Ekbote et al. | 427/62 |
| 7,792,560 | B2* | 9/2010 | Ekbote et al. | 505/220 |
| 2003/0199395 | A1* | 10/2003 | Zhou | 505/776 |

OTHER PUBLICATIONS

Ekbote et al, "Preparation and characterization of Ag-added Bi1.84Pb0.4Sr2Ca2.2Cu3O10+x bulk tube conductors for cryogen free superconducting magnet," Bull. Mater. Sci., 2001, 24(6), pp. 603-609.*

* cited by examiner

*Primary Examiner* — Stanley Silverman
*Assistant Examiner* — Kallambella Vijayakumar
(74) *Attorney, Agent, or Firm* — Ladas & Parry LLP

(57) ABSTRACT

The present invention provides a process for joining oxide-superconducting tubes with a superconducting joint. The process involves the preparation of a partially preformed superconducting material, followed by cold isopressing of the powder of partially performed superconducting material into tube shape and further provided with grooves at both ends of the tubes with a subsequent deposition of a silver layer. The process further involves the lapping of one of the end faces of a pair of said tubes to be joined. These lapped end faces of both the tubes clubbed together on a common silver bush are coated with a paste of the same partially preformed superconducting material in organic formulation. Then these coated end faces are closed pressed together to form a joint. This joint portion and the end portions of the tubes are wrapped with a perforated silver foil followed by deposition of another layer of silver. Finally, the assembly of this joint portion and the pair of tubes is heat treated in air for 100 to 150 hours and at temperatures from 830° to 850° C. The joint made according to this process is able to stably carry not less than 80% of the transport current of the high temperature superconducting tubes.

11 Claims, 6 Drawing Sheets

PROCESS FOR JOINING OXIDE SUPERCONDUCTING TUBES WITH A SUPERCONDUCTING JOINT

FIELD OF THE INVENTION

The present invention relates to a process for joining oxide-superconducting tubes with a superconducting joint. More particularly, it relates to joining oxide superconducting $(Bi,Pb)_2 Sr_2 Ca_2 Cu_3 O_{10+x}$ tubes with a superconducting joint that stably carries transport current with minimum degradation. Using this process, long conductors with strong superconducting joint can be developed particularly for applications like superconducting transmission cables, current leads, medical MRI systems, superconducting power reserving systems etc.

BACKGROUND OF THE INVENTION

One of the major problems inhibiting widespread applications of oxide superconductors particularly to either large-scale or complicated systems, for example, for superconducting transmission cables, bus bar, nuclear magnetic resonance (NMR) systems, medical diagnostic tools (e.g. magnetic resonance imaging (MRI)), superconducting magnet energy storage systems (SMES), superconducting generators single-crystal drawing-up systems in a magnetic field, freezer cooling superconducting magnets, nuclear fission reactor magnets, accelerators, magnetic separation units, large scale devices, current leads and the like, where it is necessary not only to pass transport current as high as $10^3$ A or more but is also essential to have a long conductor with stable superconductivity along its entire length. And it is impossible to fabricate the whole system in a single piece. Consequently, it is frequently necessary to join superconductors to each other (end-to-end) in order to form a joined superconductor of sufficient length, which is stabilized and is in a state capable of ensuring a heavy current. Thus it is very essential that these joints between such superconductors must have the same superconducting properties, as of the original shorter length itself to be useful in a given application.

Further, it is also necessary that a technique be available for removing and replacing a section of the superconducting material if it becomes damaged by the thermal/mechanical shocks while working. The contact between the replaced new piece and the undamaged sections of the original piece must be superconducting and also should have the same current capacity as the original and replaced piece themselves.

So far established technique for making superconducting joint for metal superconductors, such as NbTi and $Nb_3Sn$ is in the wire form. In contrast to these metal superconductors, the situation for oxide superconductors is particularly problematic due to their brittle nature, poor ductility and low breaking resistance etc.

To produce joints between oxide superconductors, similar methods like overlapping fusing, laser welding, spot welding, soldering, brazing, lap joining, butt joining, ultrasonic joining, laminate joining etc. as used for metal superconductors are developed. However, these are related to Ag-clad wires/tapes of both mono and multifilaments [Japan. J. Appl. Physics, vol. 34, p. 4770 (1995); U.S. Pat. Nos. 6,133,814; 6,159,905, 6,753,748, Appl. Supercond, vol, 3, p 207 (1995); Supercond. Sci. Technol. Vol, 13, p. 237 (2000); U.S. Pat. No. 6,194,2226]. On the other hand, very few methods for joining oxide bulk superconductors in bulk form like bars, disks, rods etc. have been proposed up to now. But these are now beginning to attract more attention.

Reference may be made to two Japanese Patents Laid-open No. Hei 1 (1989)-24379; and Japanese Patent Laid-open No. Hei 1 (1989)-17384, wherein the joint parts are produced through solid state reaction. Both these methods lead to randomly oriented and low-density joined parts that a sufficient critical current density $(J_c)$ is hard to procure.

In another reference: "Journal of the Electrochemical Society, volume 136, Number 2, pp 582-583 (February 1989)", Y. Tzeng discloses an improved method, wherein the joint portion is produced through melting using an autogeneous welding technique in which end faces of two bar pieces of preformed superconducting bulk $YBa_2 Cu_3 O_{7-x}$ are overlapped, heated to melt and fused together with a subsequent recovery heating of the joined portion. It is taught that the joint having Jc which is about the same as that of the original component bars can be produced by this method.

In U.S. Pat. No. 5,244,876, a similar autogeneous welding technique to join preformed silver sheathed $Bi_2Sr_2Ca_1Cu_2O_{8+x}$ superconducting rods/disks, has been used but with a change. Instead of overlapping, the disclosure places end faces of the two superconductors close together with a gap and filling this gap with molten material of the same superconducting rod followed by recovery heating of the joined portion.

The above two known joining methods have the following problems. The joint is generally resistive, because the joint parts thereof are produced through melting of the preformed superconducting phase, that a full recovery of damaged superconducting phase is hard to procure.

Li et. al. in reference: J. Less-Common Met. Vol-164/165, p. 660 (1990), disclosed a welding method for joining of preformed Bi-based superconducting bars by using an LPG-$O_2$ flame. It is taught that during welding, the top of the samples soon melted and a gap appears, and the tiny particles from the same melt is added to fill the gap. Then reporting formation of a superconducting joint after a heat treatment. However, drawback of this method is that the joint portion is larger, which makes the joint mechanically poor.

J. Cai et. al in reference: Supercond. Sci. Technol. volume 5, p 599 (1992) disclosed a Microwave technique for joining of (Bi,Pb)-2223 preformed superconducting bars end to end under an axial compressive load and then reporting mechanically strong joint. However, drawback of this method is that the disclosures do not disclose about the superconducting properties of the joint.

In U.S. Pat. Nos. 5,116,810 and 5,321,003, both to Joshi et al, also make use of a similar method but in contrast to joint formation between preformed superconducting components, the joint according to this patent is formed between shaped pieces of metallic precursor rare earth elements and the joined portion is spot welded with a subsequent heating to form superconducting phase. Although, the joints formed prior to formation of superconducting phase are substantially non-resistive in nature, however, it is frequently inconvenient to perform such joining operations on elemental precursors, rather than on components in the superconducting state.

Mutoh et. al. in Japanese J. Apply. Phys. Vol. 29, No. 8, p L1432 (August 1990) disclosed a method using (Bi,Pb)-2223 tablets pumped up from melts. Joint is formed between a pair of such tablets: unannealed, annealed and annealed with an unannealed insert plate. Two tablets aligned, one on top of the other, and hot pressed at various temperatures and pressures. Then reporting, a good superconducting joint can only be obtained when annealed starting melt (i.e. second case) was used. Drawback of this method lies in the presence of unavoidable traces of impurity phases both in the bulk as well as in the joined portion, thereby leading to a poor quality end product.

In another reference: Jap. J. Appl. Phys. Vol. 29, p L875 (1990), although the disclosure used the same hot pressing method as used in the above citation, for joining of thick films, however, concludes differently. That is, according to this study, acceptable joints are only possible with completely reacted material rather than precursor material for the hot pressing process. However, drawback of this method is that weak superconducting joints are formed.

In the methods described in Japan Patents Laid-open Nos. 5 Hei 3 (1991)-242384; Hei 3 (1991)-254473, use is made of partial melt solidification (i.e. crystallization from the melted state) of the preformed superconducting bodies of Bi-2212 to be joined to produce a dense and oriented matrix in the joint portion so as to result in a superconducting joint. For this method of crystallization from the melted state, use of a method of insertion of an intervening substance having lower melting point than that of the connecting bodies is made. According to the method in former patent an intervening substance is either a precursor or calcined body in powder form which is filled in the joint part, followed by thermal treatment for crystallization from the melted state. Whereas in this method, the joint part is largely oriented and dense in comparison to the above methods. This method, however, has a draw back due to difference in thermal treatments (by about 10° C.) of the bodies to be joined and of the intervening substance because of their different melting temperatures, good jointing can be attained only with much difficulty. Further, if the intervening substance is singly melted, the crystal growing in liquid phase is hardly connected to the bodies to be joined.

In the method disclosed in the latter patent, the intervening substance is a calcined powder containing Bi-2212 phase. Disadvantage of this method lies in the reduction of crystal orientation at the joint part as compared with the orientation within the component parts due to variation in the melting temperature as a result of changing ratio of the calcined powder mixed to the Bi-2212 phase as the heating proceeds. Consequently, it leads to reduction of Ic at the joint part.

An improvement in the above method is disclosed in U.S. Pat. No. 6,258,754, wherein the overall assembly of joining $YBa_2Cu_3O_{7-Y}$ powder sandwiched between two independent performed superconducting single $YBa_2Cu_3O_{7-x}$ domains and of the joint portion is heat-treated such that melting occurs only in the interface and the bonding material grows epitaxially. Then reporting strongly linked bars. Rings (rectangular or square) can also be joined together by stacking one over the other. This method however, has a drawback when a powder is used as the joining material, the air present between the particles cannot escape even in the course of melting and solidification of the joining material and therefore, result in not only pores but also segregation of impurities in the joined portion.

To overcome the problem occurring due to trapped air with the use of powder of $YBa_2Cu_3O_{7-Y}$ as the joining material in the above patents, Iida et. al. in U.S. Pat. No. 7,001,870 made use of a sintered dense material of $YBa_2Cu_3O_{7-Y}$ which is interposed between two sintered $YBa_2Cu_3O_{7-Y}$ blocks, and this sintered joining material is melted and then solidified to form a joining layer, thereby joining the $YBa_2Cu_3O_{7-x}$ rectangular blocks. Although, this sintered material provided a relatively better joint, however, the drawback of this method is that, even a slight difference in the recrystallization points, crystal structures etc. of the joining material from that of the $YBa_2Cu_3O_{7-x}$ blocks fails to make a strong superconducting joint.

All the above methods having their own merits and limitations are related to joining of bulk bodies in solid form: like wires/tapes, Ag-sheathed rods, ribbons, sheets, bars, blocks and in hollow form: like rings having rectangular or square cross section and not having circular cross-section in order to keep the interface angle below 10 degree for easy joining and that too by stacking samples of small size in millimeter range. Thus, attention has not been paid to a method for joining together hollow bodies of large size and having circular cross section, like tube conductors which are now under rapid technical development due to their Ic values which are not much limited by the self-magnetic field in comparison to those of the solid rod conductors.

OBJECTIVES OF THE INVENTION

The main object of the present invention is to provide a process for joining oxide superconducting bulk in hollow tubular form (tubes) with a superconducting joint.

An other object of the present invention is to provide a superconducting joint for joining oxide superconducting tubes made of $(Bi,Pb)_2Sr_2Ca_2Cu_3O_{10+x}$ abbreviated as (Bi, Pb)-2223 material, which is particularly preferable in view of its high critical temperature (Tc), a high critical current density (Jc), low toxicity and unnecessity for rare earth elements.

Yet another object of the present invention is to provide a process for joining (Bi,Pb)-2223 bodies by using a partially preformed superconducting powder.

Yet another object of the present invention is to use the calcined superconducting material by heating a spray dried powder.

Yet another object is to provide the use of spray dried powder obtained from spray drying of a solution of constituent raw materials by using spray drying method.

Yet another object of the invention is to provide a process for arranging the ends of the tube material in contact to each other.

Still another object of the invention is to provide a superconducting joint with degradation in critical current (Ic) not more than 10%.

SUMMARY OF THE INVENTION

Accordingly the present invention provides a process for joining oxide superconductor tubes with a superconducting joint, the said process comprising the steps of:
 i) preparing separately the water-based solutions of nitrates of Bi, Pb, Sr, Ca and Cu and mixing the above said solutions together with Ag to obtain a single solution;
 ii) spray drying the resultant nitrate solution mixture obtained in step (i) to obtain a spray dried powder;
 iii) calcining the spray dried powder obtained in step (ii), followed by subsequent grinding and mixing to obtain a homogenous calcined powder;
 iv) cold isopressing the calcined powder obtained in step (iii) into a large size tube of length of up to about 500 mm, outer diameter up to about 150 mm and wall thickness in the range of 2 to 10 mm;
 v) sintering the cold isostatically pressed tubes obtained in step (iv) and grinding the above said sintered oxide superconductor tubes into powder, followed by mixing to obtain the homogenous partially preformed superconducting phase powder;

vi) cold isopressing the partially preformed superconducting oxide powder of step (v) into tubes of different size;

vii) grooving both end portions of the tubes of step (vi) and depositing a metal silver layer on the above said grooves, followed by lapping one of the end faces of a pair of above said tubes and arranging them in close contact to each other by inserting a silver bush inside the contacting end portions of the tube pair and further applying a paste of the intervening material on the said lapped end faces;

viii) physically contacting the said coated end faces and wrapping the said physically joined portion with a perforated silver foil and further depositing a silver layer by a metal spray gun and ix) heating the above said combination of the said joint portion and the tube pair, at a temperature in the range of 830°-850° C. in air, for a time period of 100-150 hrs to obtain the superconducting joint between a pair of tubes.

In an embodiment of the present invention the oxide superconducting tubes used is a pair of hollow cylindrical tubes of length in the range of 122-320 mm.

In yet another embodiment the wall thickness of the oxide superconducting tubes used is in the range of 1-3 mm.

In yet another embodiment the outer diameter of the oxide superconducting tubes used is in the range of 10-32 mms.

In yet another embodiment wherein the molar ratio of Bi, Pb, Sr, Ca, Cu along with silver used is 1.84:0.35:1.9:2.05:3.05:1.2.

In yet another embodiment the oxide superconductor material used is Ag added $(Bi,Pb)_2Sr_2Ca_2Cu_3O_{10+x}$ In yet another embodiment the superconducting joint has critical current of 70-90% lesser than the critical current of unitary oxide superconducting tubes.

In yet another embodiment the superconducting joint comprises the same material as of oxide superconducting tubes.

In yet another embodiment the powder material used in oxide superconducting tubes to be joined is partially preformed superconducting powder.

In yet another embodiment the intervening/joining material used is a paste of partially preformed superconducting powder in isoamylacetate and fish oil.

In yet another embodiment the joint material used is a paste of partially preformed superconducting powder in organic formulation using polyvinyl butryal (binder), cyclohexanone (solvent) and fish oil (dispersant)

In still another embodiment the joint material used is a paste of partially preformed superconducting powder in air-drying silver paint.

DETAIL DESCRIPTION OF THE INVENTION

Figure 1:
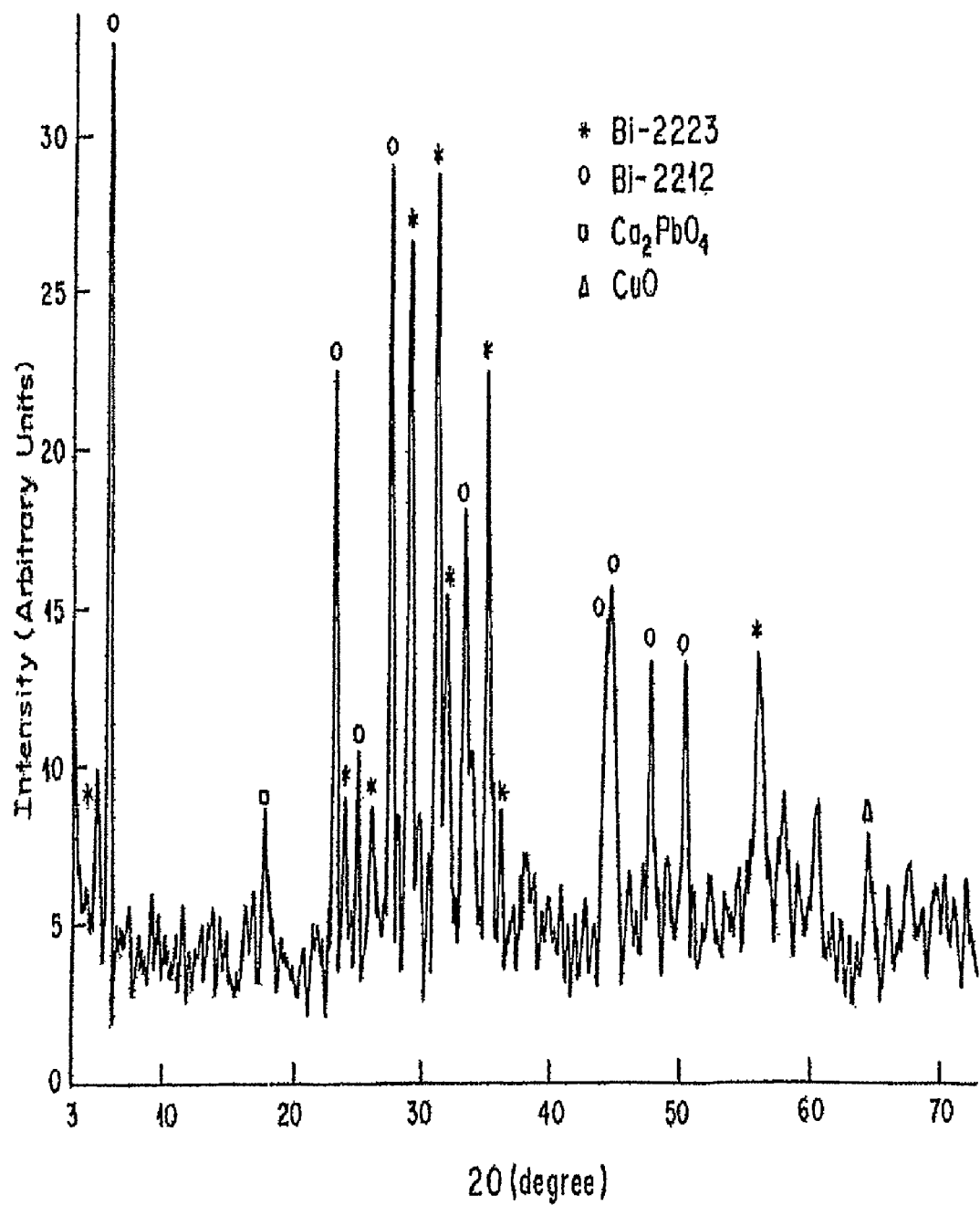
FIG. 1 represents the x-ray diffraction pattern of powder of partially preformed superconducting material showing the presence of desired superconducting phases: $(Bi,Pb)_2Sr_2Ca_2Cu_3O_{10+x}$[(Bi,Pb)-2223] and other phases: $Bi_2Sr_2CaCu_2O_{8+x}$[Bi-2212] $Ca_2PbO_4$ and CuO as secondary phases.

In the present invention a process for joining a pair of tubes of oxide superconductor particularly to $(Bi\ Pb)_2\ Sr_2\ Ca_2\ Cu_3\ O_{10+x}$ [Bi, Pb)-2223] is disclosed. In this, the said joined pair is a current lead in tube shape with both end silver metallic contacts. To produce such a joined lead of longer length, the method included a step of preparing a starting powder of high temperature superconductor of $(Bi\ Pb)_2\ Sr_2\ Ca_2\ Cu_3\ O_{10+x}$ with addition of Ag from spray drying method with an immediate calcination. Cold isopressing of the calcined powder into a tube with a subsequent sintering followed by grinding and mixing to obtain a homogeneous partially preformed superconducting powder. Then cold isopressing of partially preformed superconducting powder material in tube shape. Lapping one of the end faces of such a pair of tubes. Clubbing the said pair of tubes longitudinally end to end on a silver bush so that the lapped end faces are in contact with each other. It is these end portions where the joint is formed. Applying a paste of the same said partially preformed superconducting powder material on the said lapped faces. These coated end faces are put in contact touching each other, subsequently wrapped with a perforated silver foil and deposited metal silver layer by spray gun. Followed by a final step of co-sintering the overall assembly of this contact portion and the tube pair in air. The joint has made on tubes of different dimensions. The joint made has critical current (Ic) not less than at least 90% of the lesser of the critical current of the individual tubes. Further, the joint is capable of carrying a continuous current of more than 500 Amp. at 77 K in self-field. The contact resistivity of the joint is not less than $10^{-6}$-$10^{-7}$ micro ohms at 77 K.

In a feature of the present invention, the calcinations of the starting spray dried is effected at a temperature of the order of 800°±10° in air for a period of the order of one hour to obtain a precursor powder for sintering.

In another feature of the present invention, the cold isopressing of the calcined powder into a large size tube is effected at a pressure of 300 MPa.

In yet another feature of the present invention, the size of the tube obtained from cold isostatically pressed calcined powder is of the length of the order of 430 mm, outer diameter of the order of 50 mm and wall thickness in the range of 2 to 3 mm.

In yet another feature of the present invention, the grinding of the first sintered oxide superconductor tube into powder and mixing is effected by known methods.

In still another feature the cold isopressing of the first sintered tube powder (hereafter, referred as partially preformed superconducting powder material) into tubes is effected at a pressure of 400 MPa.

In yet another feature of the present invention, the organic formulation consists of polyvinyl buturyal (binder) cyclohexane (solvent) and fish oil (dispersant).

In yet another feature of the present invention, weight of partially preformed superconducting powder material in the paste varies from 4 gms to 8 gms.

In yet another feature of the present invention the quantity of polyvinyl buturyal in the paste varies from 0.4 gm to 1.2 gms In yet another feature of the present invention the quantity of cyclohexanone in the paste varies from 2 C.C to 5 C.C.

In yet another feature of the present invention, the paste of partially preformed superconducting powder material may be made in silver paste in weight ratio of 10:1.

In still another feature of the present invention, the organic formulation may be isoamylacetate whose quantity varies from 3 C.C to 7 C.C. for 5 gms to 7 gms of the partially preformed powder material.

This invention addresses a technique that can be utilized to develop strongly joined tubes of various sizes with high current-carrying capacity desirable for various applications such as magnetic shields, fault current limiters, current leads, and the like. The joint can carry continuous transport current more than 500 A at 77K in self-field. This is a novel method of joining oxide superconductor components because the present invention provides joints between bodies which are hollow and that can account for the superconductivity.

The novelty of the present invention lies in a process for preparing a superconducting joint between hollow oxide superconductors which is superconducting with carrying capacity of more than 500 A. The non obvious inventive step is the use of partially preformed superconducting bodies and applying a paste of the same material with an organic formulation on the end faces of these bodies by simple steps as detailed herein above.

This joining technique may be applied widely to superconducting appliances for example, superconducting transmission cables, bus bars, long conductors, permanent current switch devices, nuclear magnet resonance systems, medicinal MRI systems, superconducting power reserving systems, magnetic separation units, single crystal drawing-out systems in magnetic fields, freezer cooling superconducting magnet systems and the like and also to the application of high field magnet systems, where long length current leads are required for instance to connect a power source or other conventional equipments like accelerators etc. to the superconducting components.

Figure of the drawings 1 illustrates X-ray diffiractrogram of partially preformed powder material used for making tubes as joining bodies and also used as a bonding material showing the presence of desired superconducting (Bi,Pb)-2223 phase along with secondary phases: Bi-2212, $Ca_2PbO_4$ and CuO.

Figure 2:
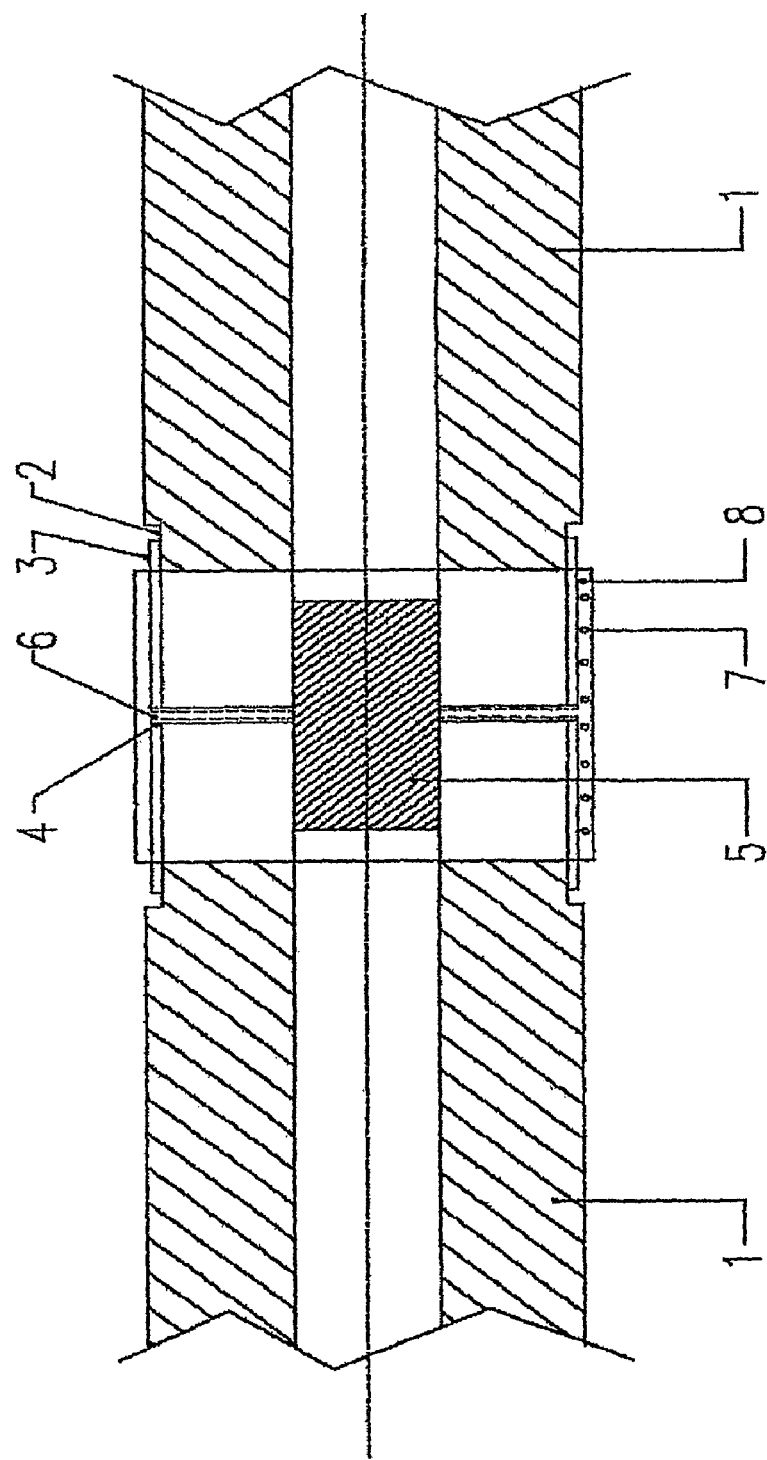
FIG. 2 represents the joint of the invention between a pair of tubes of different dimensions: numeral (1) is an oxide superconducting tube; numeral (2) is a groove; numeral (3) is a silver layer, numeral (4) is lapped end face; numeral (5) is a silver bush; numeral (6) is a paste of the intervening substance; numeral (7) is a perforated silver foil and numeral (8) is a silver layer.

The process of making joint between a pair of tubes in accordance with the present invention is illustrated in FIG. 2 of the drawings accompanying this specification, wherein reference numeral 1 is a $(Bi,Pb)_2Sr_2Ca_2Cu_3O_{10+x}$ tube; numeral 2 designates: groove; numeral 3 is a silver layer; numeral 4 is a lapped face; numeral 5 is a silver bush; numeral 6 is a paste; numeral 7 is a perforated silver foil; and numeral 8 is a silver layer.

Figure 3:
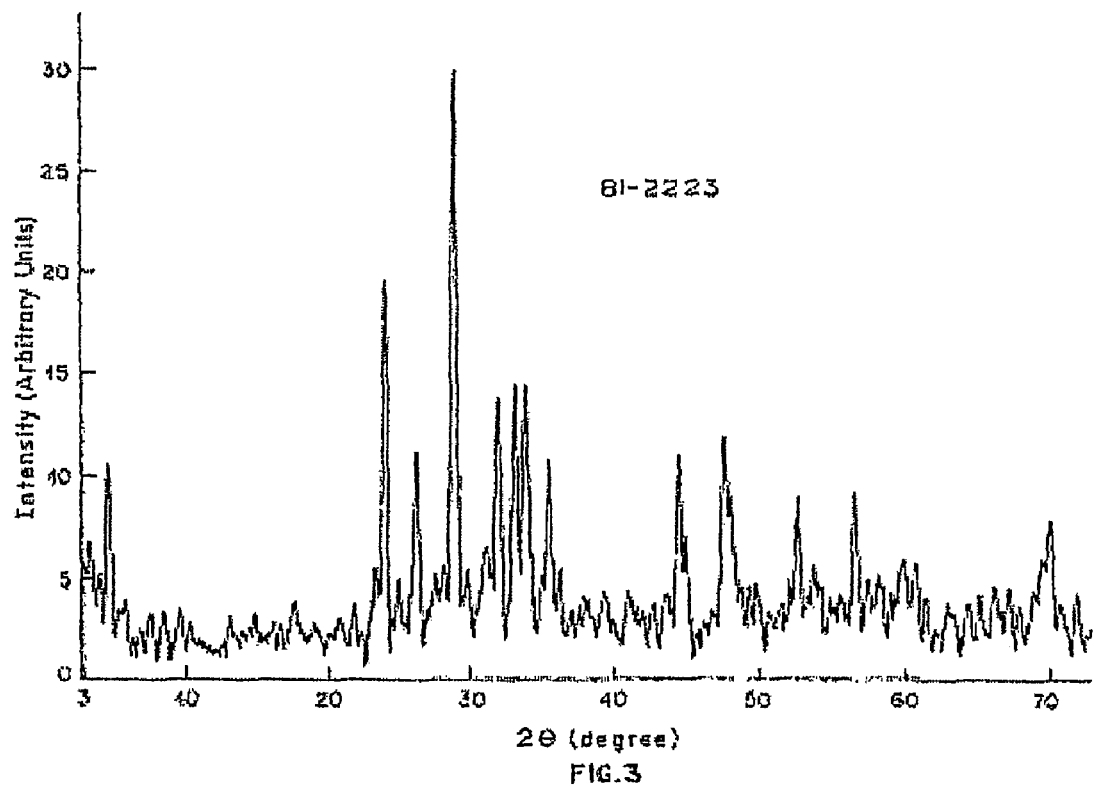
FIG. 3 represents the X-ray diffraction pattern of component tube of FIG. 2 showing the presence of the desired superconducting phase: $(Bi,Pb)_2Sr_2Ca_2Cu_3O_{10+x}$x[(Bi,Pb)-2223].

FIG. 3 illustrates the X-ray diffractogram of the unitary tube conductor of FIG. 2 made according to the method of the present invention showing the presence of desired (Bi,Pb)-2223 phase.

For phase identification of both the partially preformed powder material and of the unitary tube of FIG. 2 prepared by the process of the present invention were taken by using a Brucker D-8 powder X-ray diffractrometer with $CuK_\alpha$ radiations.

Figure 4:
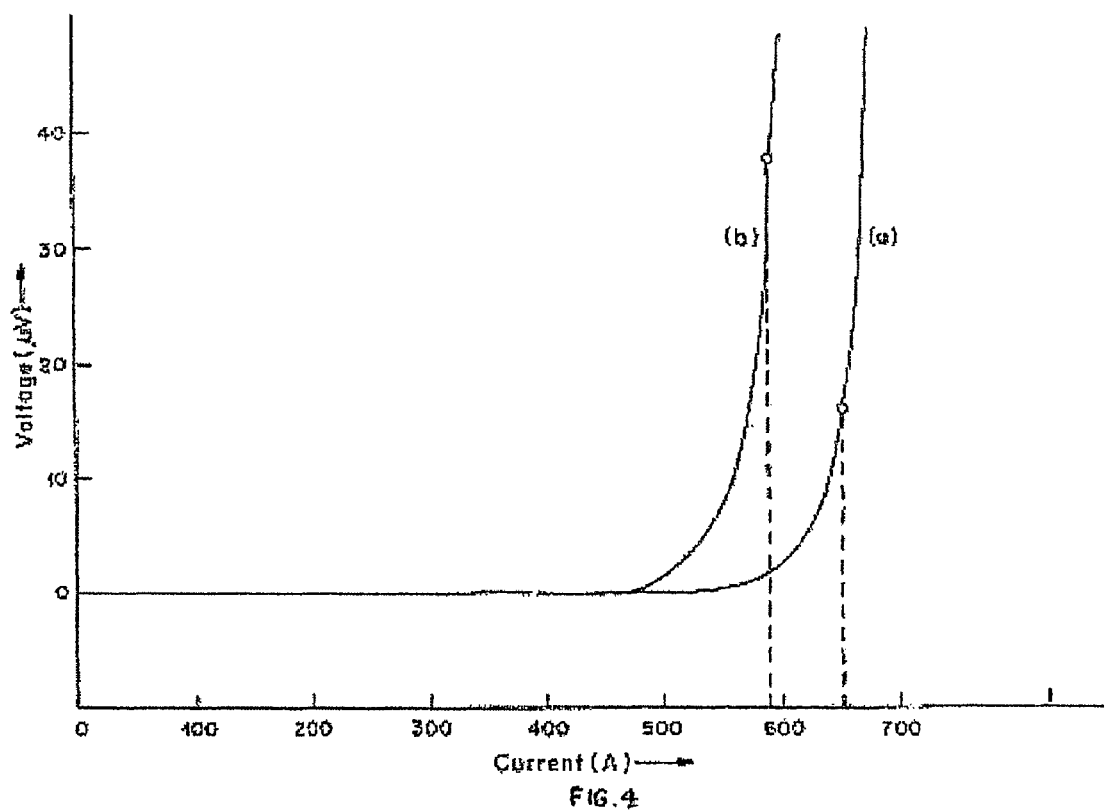
FIG. 4 graphically represents the relationship between voltage and current through a unitary superconductor on the one hand and a superconductor joined according to the method of the invention on the other hand.

FIG. 4(*a*) & (*b*) of the drawings represents the relationship between voltage and current through (a) a unitary superconductor on the one hand (b) a superconductor joined made according to the method of the invention on the other hand. Critical current (Ic) was determined using 1 micro-volt/cm criterion.

Figure 5:
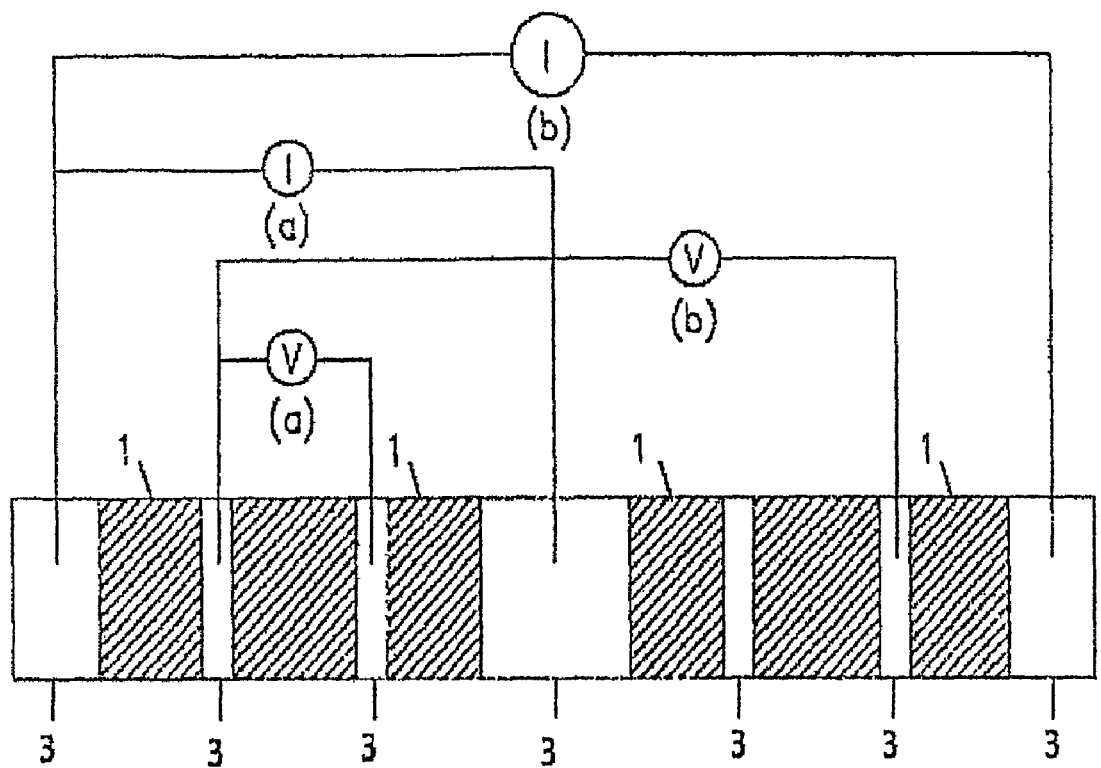
FIG. 5 represents a schematic drawing of the set up for measuring the voltage and current represented in FIG. 4 for finding critical current (Ic)
Figure 6:
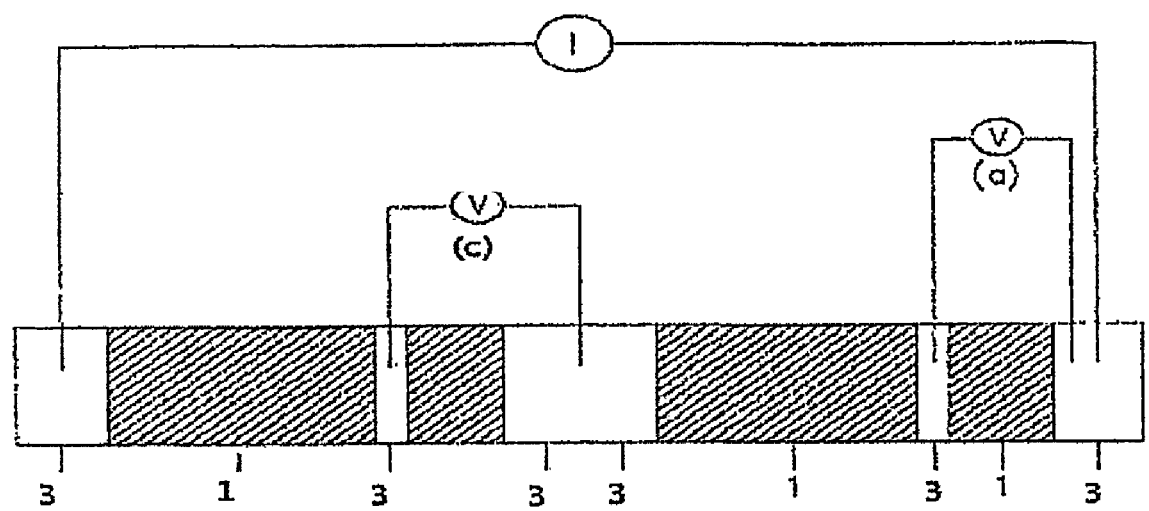
FIG. 6 represents a schematic drawing of the set up for measuring the contact resistivity of the unitary superconductor on the one hand and a superconductor joined according to the method of the invention on the other hand.

The critical current (Ic) and voltage of the unitary tube superconductor (a) and of the joined tube pair (b) prepared by the process of the present invention described herein above were measured by four-terminal method as illustrated in FIG. 5 of the drawings accompanying this specification. Contact resistivity of the unitary tube superconductor (a) and of the joint part (c) was also measured by four terminal methods as illustrated in FIG. 6 of the drawings accompanying this specification. For this, eight terminals designated with numeral (2) were made on the superconductor portion designated with numeral (1). All these terminals were of silver. Two outer and two middle terminals (electrode portion) were current terminals and the inner two terminals on either side of the middle current terminals were voltage terminals. In four-probe method, for voltage taps, air-drying silver paste was used and connecting copper leads were soldered directly to the superconductor close the current contact. Accuracy of the measurements was about ±10%. The measurements were at a sample temperature of 77 K and in zero magnetic fields (OT).

The following examples are given by way of illustration and therefore, should not be construed to limit the scope of the present invention.

EXAMPLE-1

Spray dried starting powder with addition of silver was prepared by weighing each raw nitrate powder of the constituent elements Bi, Pb, Sr, Ca and Cu in mole ratio of 1.84:0.35:1.91:2.05:3.05 and Ag in mole ratio of 1.2. These were dissolved in double distilled water. This nitrate solution was spray dried to get a homogeneous starting powder with uniform addition of Ag. This spray dried powder was then calcined immediately in air for 1 hour in an electric furnace already set at 800° C. This calcined was ground and mixed in a mortar and pestle with a subsequent cold isopressing at a pressure of 300 MPa into a tube shape, which was 430 mm long with outer diameter of 50 mm and inner diameter of 47 mm. Then this tube was sintered at 830° C. in air for 80 hours followed by crushing and mixing to obtain partially preformed superconducting powder material. This powder mainly consisting of superconducting Bi-2212/Bi-2223 phases and non-superconducting: $Ca_2PbO_4$, CuO phases (i.e. partially preformed into desired Bi-2223 superconducting phase as revealed by X-ray diffraction pattern shown in FIG. 1) was cold-isostatically pressed into tubes of length=122 mm, outer diameter=12.4 mm and wall thickness=1.2 mm (1) as shown in FIG. 2.

15 mm long groove (2) was made at both ends of these partially preformed superconducting tubes (1) followed by deposition of a layer of silver metal layer (3). An end face of this partially preformed superconducting tube (1) was lapped to expose a fresh surface (4) as shown in FIG. 2 A pair of such tubes was so clubbed together by inserting a silver bush; (5) of size: L=15 mm, O.D.=9.9 mm and I.D.=7.9 mm inside the end portions that the lapped end faces (4) of the superconductors (1) as shown in FIG. 2 were in close contact with a gap. A paste (6) consisting of 5 gms of the same partially performed superconducting powder with 0.6 gms of polyvinyl butryal (binder), 3 C.C of cyclohexane (solvent) and 1 drop of fish oil (dispersant) was applied at the said lapped end face. A pair of such tubes was taken and brought into contact so that their coated end faces touch each other.

This physically joined portion was subsequently wrapped with a perforated silver foil (7) followed by metal silver spray deposited layer (8) as shown in FIG. 2.

Finally, the assembly of a pair of partially preformed superconducting tubes and the joined portion was sintered in an electric muffle furnace at 835° C. for 100 hrs in air to obtain the joined pair with desired Bi-2223 phase. The formation of Bi-2223 phase was confirmed by X-ray diffraction pattern as shown in FIG. 3. At the liquid nitrogen temperature (77 K) under zero-magnetic field (OT), the joint part of this tube pair showed contact resistivity ($\rho c$) of 0.42 $\mu$Ohm-cm$^2$, which was more than an order of magnitude higher than that of the unitary tube (0.035 $\mu$Ohm-cm$^2$) at 77 K, OT. At that time, the joint of this tube pair exhibited a critical current of 215 A, which was quite lower than that of the component tube (300 A) at 77 K, OT, and the percentage critical current retention of the joined tube pair was 71%. The obtained results are shown in Table-1.

EXAMPLE-2

The partially preformed superconducting phase powder material was prepared in the same manner as in Example 1.

This powder mainly consisting of superconducting Bi-2212/Bi-2223 phases and non-superconducting Ca$_2$PbO$_4$, CuO phases (i.e. partially preformed into desired Bi-2223 superconducting phase as revealed by X-ray diffraction pattern shown in FIG. 1) was cold-isostatically pressed at 400 MPa into four tubes of length=122 mm, outer diameter=12.4 mm and wall thickness=1.2 mm (1) as shown in FIG. 2.

15 mm long groove (2) was made at both ends of these partially preformed superconducting tubes (1) followed by deposition of a silver layer (3). An end face of this partially preformed superconducting tube (1) was lapped to expose a fresh surface (4) as shown in FIG. 2. A pair of such tubes was so clubbed together by inserting a silver bush (5) of size: L=15 mm, O.D.=9.9 mm and I.D.=7.9 mm inside the end portions that the lapped end faces of the superconductors (1) as shown in FIG. 2 were in close contact with a gap. A paste (6) consisting of 5 gms of the same partially preformed superconducting powder 0.8 gms of polyvinyl buturyal (binder), 4 C.C. of cyclohexanone (solvent) and 2 drops of fish oil (dispersant) was applied at the said lapped end faces, which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 2.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 phase was confirmed by X-ray diffraction pattern as shown in FIG. 3. At 77 K, under OT, the joined portion of this tube pair showed contact resistivity ($\rho c$) of 0.31 $\mu$Ohm-cm$^2$ which is an order of magnitude higher than that of the component tube (0.035 $\mu$Ohm-cm$^2$) at 77 K, OT. At that time the joint of this tube pair exhibited a transport current of 237 A, which was lower than to that of the component tube (300 A) at 77 K, OT and the percentage critical current retention of the joined tube pair was 79%. The obtained results are shown in Table-1.

EXAMPLE-3

The partially preformed superconducting phase powder material was prepared in the same manner as in Example 1.

This powder mainly consisting of superconducting: Bi-2212/Bi-2223 phases and non-superconducting: Ca$_2$PbO$_4$, CuO phases (i.e. partially preformed into desired Bi-2223 superconducting phase as revealed by X-ray diffraction pattern shown in FIG. 1) was cold-isostatically pressed at 400 MPa into four tubes of length=122 mm, outer diameter=12.4 mm and wall thickness=1.3 mm (1) as shown in FIG. 2.

15 mm long groove (2) was made at both ends of these partially preformed superconducting tubes (1) followed by deposition of a silver layer (3). An end face of this partially preformed superconducting tube (1) was lapped to expose a fresh surface (4) as shown in FIG. 2. A pair of such tubes was so clubbed together by inserting a silver bush (5) of size: L=15 mm, O.D.=9.9 mm and I.D.=7.9 mm inside the end portions that the lapped end faces (4) of the superconductors (1) as shown in FIG. 2 were in close contact with a gap. A paste (6) consisting of 5 gms of the same partially preformed superconducting powder with 1.0 gm of polyvinyl buturyal (binder), 5 C.C. of cyclohexanone (solvent) and 3 drops of fish oil (dispersant). was applied at the said lapped end faces, which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 2.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 phase was confirmed by X-ray diffraction pattern as shown in FIG. 3. At 77 K under OT, the joined portion of this tube pair showed contact resistivity of 0.32 $\mu$Ohm-cm$^2$ which is an order of magnitude lower than that of the component tube (0.035 $\mu$Ohm-cm$^2$) at 77 K, OT. At that time the joint of this tube pair exhibited a transport current of 227 A, which was quite lower than to that of the component tube (300 A) and the percentage critical current retention of the joined tube pair was 75%. at 77 K, OT. The obtained results are shown in Table-1.

EXAMPLE-4

The partially preformed superconducting phase powder material was prepared in the same manner as in Example 1.

This powder mainly consisting of superconducting Bi-2212/Bi-2223 phases and non-superconducting Ca$_2$PbO$_4$, CuO phases (i.e. partially preformed into desired Bi-2223 superconducting phase as revealed by X-ray diffraction pattern shown in FIG. 1) was cold-isostatically pressed at 400 MPa into four tubes of length=122 mm, outer diameter=12.4 mm and wall thickness=1.2 mm (1) as shown in FIG. 2.

15 mm long groove (2) was made at both ends of these partially preformed superconducting tubes (1) followed by deposition of a silver layer (3). An end face of this partially preformed superconducting tube (1) was lapped to expose a fresh surface (4) as shown in FIG. 2. A pair of such tubes was so clubbed together by inserting a silver bush (5) of size: L=15 ml, O.D.=9.9 mm and I.D=7.9 mm inside the end portions that the lapped end faces (4) of the superconductors (1) as shown in FIG. 2 were in close contact with a gap. A paste (6) consisting of 5 gms of the same partially preformed superconducting powder in 4 C.C. of isoamylacetate was applied at the said lapped end faces, which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 2.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 phase has been confirmed by X-ray diffraction pattern as shown in FIG. 3. At 77 K under OT, the joined portion of this tube pair showed contact resistivity of 0.30 $\mu$Ohm cm$^2$ which is an order of magnitude higher than that the component tube (0.035 $\mu$Ohm-cm$^2$) at 77 K, OT. At that time, the joint of this tube pair exhibited a transport current of 258 A, which was quite lower than to that of the component tube (300 A) at 77 K, OT and the percentage critical current retention of the joined tube pair was 86%. The obtained results are shown in Table-1.

EXAMPLE-5

The partially preformed superconducting phase powder material was prepared in the same manner as in Example 1.

This powder mainly consisting of superconducting Bi-2212/Bi-2223 phases and non-superconducting Ca$_2$PbO$_4$, CuO phases (i.e. partially preformed into desired Bi-2223 superconducting phase as revealed by X-ray diffraction shown in FIG. 1) was cold-isostatically pressed at 400 MPa into four tubes of length=122 mm, outer diameter=12.4 mm and wall thickness=1.2 mm (1) as shown in FIG. 2.

15 mm long groove (2) was made at both ends of these partially preformed superconducting tubes (1) followed by deposition of a silver layer (3). An end face of this partially preformed superconducting tube (1) was lapped to expose a fresh surface (4) as shown in FIG. 2. A pair of such tubes was so clubbed together by inserting a silver bush (5) of size: L=15 mm, O.D.=9.9 mm and I.D.=7.9 mm inside the end portions that the lapped end faces (4) of the superconductors (1) as shown in FIG. 2 were in close contact with a gap. A paste (6) consisting of 5 gms of the same partially preformed superconducting powder in 5 C.C of isoamylacetate was applied at the said lapped end faces, which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 2.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 phase was confirmed by X-ray diffraction pattern as shown in FIG. 3. At 77 K under OT the joined portion of this tube pair showed contact resistivity of 0.26 $\mu$Ohm-cm$^2$ which is an order of magnitude higher than that of the component tube (0.035 $\mu$Ohm-cm$^2$) at 77 K, OT. At that time, the joint of this tube pair exhibited a transport current of 276 A, which was quite lower than to that of the component tube (300 A) at 77 K, OT and the percentage critical current retention of the joined tube pair was 90%. The obtained results are shown in Table-1.

EXAMPLE-6

The partially preformed superconducting phase powder material was prepared in the same manner as in Example 1.

This powder mainly consisting of superconducting: Bi-2212/Bi-2223 phases and non-superconducting: Ca$_2$PbO$_4$, CuO phases (i.e. partially preformed into desired Bi-2223 superconducting phase as revealed by X-ray diffraction pattern shown in FIG. 1) was cold-isostatically pressed at 400 MPa into four tubes of length=122 mm, outer diameter=12.4 mm and wall thickness=1.2 mm (1) as shown in FIG. 2.

15 mm long groove (2) was made at both ends of these partially preformed superconducting tubes (1) followed by deposition of a silver layer (3). An end face of this partially preformed tube (1) was lapped to expose a fresh surface (4) as shown in FIG. 2. A pair of such tubes was so clubbed together by inserting a silver bush (5) of size: L=15 mm, O.D.=9.5 mm and I.D=7.5 mm inside the end portions that the lapped end faces of the superconductors (1) as shown in FIG. 2 were in close contact with a gap. A paste (6) consisting of 5 gms of the same partially preformed superconducting powder in 6 C.C. of isoamylacetate was applied at the said lapped end faces, which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 2.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 phase was confirmed by X-ray diffraction pattern as shown in FIG. 3. At 77 K under OT the joined portion of this tube pair showed contact resistivity of 0.27 $\mu$L Ohm Cm$^2$ which is an order of magnitude higher than that of the component tube (0.035 $\mu$Ohm-Cm$^2$) at 77 K, OT. At that time, the joint of this tube pair exhibited a transport current of 261 A, which was lower than to that of the component tube (300 A) at 77 K, OT and the percentage critical current retention of the joined tube pair was 87%. The obtained results are shown in Table-1.

EXAMPLE-7

The partially preformed superconducting phase powder material was prepared in the same manner as in Example 1.

This powder mainly consisting of superconducting Bi-2212/Bi-2223 phases and non-superconducting Ca$_2$PbO$_4$, CuO phases (i.e. partially preformed into desired Bi-2223 superconducting phase as revealed by X-ray diffraction shown in FIG. 1) was cold-isostatically pressed at 400 MPa into four tubes of length=122 mm, outer diameter=12.4 mm and wall thickness=1.2 mm as shown in FIG. 2.

15 mm long groove (2) was made at both ends of these partially preformed superconducting tubes (1) followed by deposition of a silver layer (3). An end face of this partially preformed tube (1) was lapped to expose a fresh surface (4) as shown in FIG. 2. A pair of such tubes was so clubbed together by inserting a silver bush (5) of size: L=15 mm, O.D.=9.5 mm and I.D.=7.5 mm inside the end portions that the lapped end faces of the superconductors (1) as shown in FIG. 2 were in close contact with a gap. A paste (6) consisting of 5 gms of the same partially preformed superconducting powder in air drying silver paste was applied at the said lapped end faces (4), which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 1.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 phase was confirmed by X-ray diffraction pattern as shown in FIG. 3. At 77 K under OT, the joined portion of this tube pair showed contact resistivity ($\rho c$) of 0.33 $\mu$Ohm-cm$^2$) which is an order of magnitude higher than that of the component tube (0.035 $\mu$Ohm cm$^2$) at 77 K, OT. At that time, the joint of this tube pair exhibited a transport current of 240 A, which was lower than to that of the component tube (300 A) at 77 K, OT and the percentage critical current retention of the joined tube pair was 80%. The obtained results are shown in Table-1.

EXAMPLE-8

The partially preformed superconducting phase powder material was prepared in the same manner as in Example 1.

This powder mainly consisting of superconducting: Bi-2212/Bi-2223 phases and non-superconducting: $Ca_2PbO_4$, CuO phases (i.e. partially preformed into desired Bi-2223 superconducting phase as revealed by X-ray diffraction pattern shown in FIG. 1) was cold-isostatically pressed at 400 MPa into tubes of length=320 mm, outer diameter=12.4 mm and wall thickness=1.2 (1) mm as shown in FIG. 2.

20 mm long groove (2) was made at both ends of these partially preformed superconducting tubes (1) followed by deposition of a silver layer (3). An end face of this partially preformed superconducting tube (1) was lapped to expose a fresh surface (4) as shown in FIG. 2. A pair of such tubes was so clubbed together by inserting a silver bush (5) of sizes: L=20 mm, O.D.=9.9 mm and I.D.=7.9 mm inside the end portions that the lapped end faces of the superconductors (1) as shown in FIG. 2 were in close contact with a gap. A paste (6) consisting of 5 gms of the same partially preformed superconducting powder in 5 C.C. of isoamyl acetate was applied at the said lapped end faces (4), which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 2.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 was confirmed by X-ray diffraction pattern shown in FIG. 3 At 77 K under OT the joined portion of the tube pair showed contact resistivity ($\rho c$) of 0.26 $\mu$Ohm-cm$^2$ which is an order of magnitude higher than that of the component tube (0.035 $\mu$Ohm-cm$^2$) at 77 K, OT. At that time, the joint of this tube pair exhibited a transport current of 272 A, which was not much lower than that of the component tube (300 A) at 77 K, OT and the percentage critical current retention of the joined tube pair was 90%. The obtained results are shown in Table-1.

EXAMPLE-9

The partially preformed superconducting phase powder material was prepared in the same manner as in Example 1.

This starting powder mainly consisting of superconducting Bi-2212/Bi-2223 phases and non-superconducting $Ca_2PbO_4$, CuO phases (i.e. partially preformed into desired Bi-2223 superconducting phase as revealed by diffraction pattern shown in FIG. 1) was cold-isostatically pressed at 400 MPa into four tubes of length=220 mm, outer diameter=31.2 mm and wall thickness=1.3 mm (1) as shown in FIG. 2.

20 mm long groove (2) was made at both ends of these partially preformed superconducting tubes (1) followed by deposition of a silver layer (3). An end face of this partially preformed superconducting tube (1) was lapped to expose a fresh surface (4) as shown in FIG. 2. A pair of such tubes was so clubbed together by inserting a silver bush 5 of size: L=30 mm, O.D=28.55 mm and I.D.=22.55 mm inside the end portions that the lapped end faces (4) of the superconductors (1) as shown in FIG. 2 were in close contact with a gap. A paste (6) consisting 5 gms of the same partially preformed superconducting powder in 5 C.C. of isoamylacetate was applied at the said lapped end faces, which were then brought into physical contact, i.e.; a coated end face of one tube touches the coated end face of the other tube.

This physically joined portion was subsequently wrapped with a perforated silver foil (7) followed by metal silver sprayed layer (8) as shown in FIG. 2.

Finally, the assembly of a paste of partially transformed superconducting tubes and the joined portion was sintered in an electric muffle furnace at 835° C. for 100 hrs in air to obtain the joined tube pair with desired Bi-2223 phase. The formation of Bi-2223 phase was confirmed by X-ray diffraction pattern shown in FIG. 1. At 77 K under OT the joined portion of this tube pair showed contact resistivity ($\rho c$) of 0.02 $\mu$Ohm-cm$^2$, which is an order of magnitude higher than that of the component tube (0.001 $\mu$Ohm-cm$^2$) at 77 K, OT. At that time, the joint of this tube pair exhibited a critical current of 595 A, which was not much lower than that of the component tube 650 A at 77 K, OT and the percentage of critical current retention of the joined tube pair was 91%. The obtained results are shown in Table-1.

In Table-1 below is given the collated data from the above noted examples. The comparative data shows the critical current of the component tube, critical current of the joined pair of tubes and percentage of retention at 77 K in self-field of various (Bi,Pb)-2223 tubes and also clearly highlights the resultant novelty of superconducting joint between partially preformed hollow tubes due to non-obvious inventive steps of using a silver bush to bring the ends of the tubes in close contact and in making the joint with a paste of the partially preformed powder in an organic solvent.

TABLE 1

| Sample No | Dimensions of the tube pair to be joined. O.D. × I.D × L (mm) | Bonding Material | Contact (ρc) Resistivity, 77 K, OT (μOhm-cm²) Component Tube | Contact (ρc) Resistivity, 77 K, OT (μOhm-cm²) Joined Portion | Critical Current (Ic) 77 K, OT (A) Component Tube | Critical Current (Ic) 77 K, OT (A) Joined Pair | % Retention of (Ic) |
|---|---|---|---|---|---|---|---|
| 1 | 12.4 × 10.1 × 122 | 5 gm partially preformed superconducting powder + 0.6 gm polyvinyl butryal + 3c.c. cyclohexane + 1 drop fish oil | 0.035 | 0.42 | 300 | 215 | 71 |
| 2 | 12.4 × 10.1 × 122 | 5 gm partially preformed superconducting powder + 0.8 gm polyvinyl butryal + 4c.c. cyclohexane + 2 drops fish oil | 0.035 | 0.31 | 300 | 237 | 79 |
| 3 | 12.4 × 10.1 × 122 | 5 gm partially preformed superconducting powder + 1.0 gm polyvinyl butryal + 5c.c. cyclohexane + 3 drops fish oil | 0.035 | 0.32 | 300 | 227 | 75 |
| 4 | 12.4 × 10.1 × 122 | 5 gm partially performed superconducting powder + 4c.c. isoamylacetate + 2 drops fish oil. | 0.035 | 0.30 | 300 | 258 | 86 |
| 5 | 12.4 × 10.1 × 122 | 5 gm partially preformed superconducting powder + 5c.c. isoamylacetate + 2 drop fish oil. | 0.035 | 0.26 | 300 | 276 | 90 |
| 6 | 12.4 × 10.1 × 122 | 5 gm partially preformed superconducting powder + 6c.c. isoamylacetate + 2 drops fish oil. | 0.035 | 0.27 | 300 | 261 | 87 |
| 7 | 12.4 × 10.1 × 122 | 5 gm partially preformed superconducting powder + 0.5 gm air drying silver paste | 0.035 | 0.33 | 300 | 240 | 80 |
| 8 | 12.4 × 10.1 × 320 | 5 gm partially preformed superconducting powder + 5c.c. isoamylacetate + 2 drops fish oil. | 0.035 | 0.26 | 300 | 276 | 90 |
| 9 | 31.2 × 28.6 × 220 | 5 gm partially preformed superconducting powder + 5c.c. isoamylacetate + 2 drops fish oil. | 0.001 | 0.02 | 650 | 595 | 91 |

The Main Advantages of the Present Invention are:
1. Joined hollow oxide tube superconductors with a superconducting joint can be obtained.
2. Use of partially preformed superconducting material leads to the formation of the desired superconducting phase (Bi-2223) in pure form during final heat treatment.
3. Use of the same partially preformed superconducting material for both the bodies to be joined as well as the joining material prevents the joint and the component parts from being having different of superconducting properties due to identical heat treatment temperatures. This leads to the formation of superconducting joint with sufficient Ic.
4. Use of joining material in paste form formed from powder of the partially preformed superconducting material mixed in an organic formulation provides a homogeneous and dense packing of the superconducting particles on the end faces of the superconductors to be joined and facilitates the diffusion bonding joining.
5. It does not require higher temperatures as used in melting techniques where the full recovery of the desired superconducting phase is hard to procure.

The invention claimed is:

1. A process for joining oxide superconductors tubes with a superconducting joint, said process comprising the steps of:

i) preparing separately water-based solutions of nitrates of Bi, Pb, Sr, Ca and Cu and mixing the above solutions together with Ag to obtain a single solution;
ii) spray drying the resultant single nitrate solution mixture obtained in step (i) to obtain a spray dried powder;
iii) calcining the spray dried powder obtained in step (ii), followed by subsequent grinding and mixing to obtain a homogenous calcined powder;
iv) cold isopressing the calcined powder obtained in step (iii) into large size tubes of length of up to about 500 mm, outer diameter up to about 150 mm and wall thickness in the range of 2 to 10 mm;
v) sintering the cold isostatically pressed tubes obtained in step (iv) and grinding the sintered oxide superconductor tubes into powder, followed by mixing to obtain a homogenous partially preformed superconducting phase powder;
vi) cold isopressing the partially preformed superconducting oxide powder of step (v) into tubes of different size;
vii) grooving both end portions of the tubes of step (vi) and depositing metal silver layer on the grooves, followed by lapping one of the end faces of a pair of the tubes produced in step vi) and arranging them in close contact to each other by inserting a silver bush inside the contacting end portions of the tube pair and further applying a paste of intervening material on the lapped end faces;

viii) physically contacting the coated end faces and wrapping the physically joined portion with a perforated silver foil and further depositing a silver layer by a metal spray gun and ix) heating the above combination of the joint portion and the tube pair, at a temperature in the range of 830°-850° C. in air, for a time period of 100-150 hrs to obtain the superconducting joint between a pair of tubes.

2. A process as claimed in claim 1, wherein the oxide superconducting tubes produced in step vi) are a pair of hollow cylindrical tubes of length in the range of 122-320 mm.

3. A process as claimed in claim 1, wherein wall thickness of the oxide superconducting tubes produced in step (vi) is in the range of 1-3 mm.

4. A process as claimed in claim 1 wherein outer diameter of the oxide superconducting tubes produced in step (vi) is in the range of 10-32 mm.

5. A process as claimed in claim 1, wherein the molar ratio of Bi, Pb, Sr, Ca, Cu along with silver used is 1.84:0.35:1.9:2.05:3.05:1.2.

6. A process as claimed in claim 1, wherein the superconducting joint has critical current of 70-90% lesser than the critical current of unitary oxide superconducting tubes.

7. A process as claimed in claim 1, wherein the superconducting joint comprises the same material as of oxide superconducting tubes.

8. A process as claimed in claim 1, wherein the powder material used in oxide superconducting tubes to be joined is partially preformed superconducting powder.

9. A process as claimed in claim 1, wherein the intervening material used is a paste of partially preformed superconducting powder in isoamylacetate and fish oil.

10. A process as claimed in claim 1, wherein the intervening material used is a paste of partially preformed superconducting powder in organic formulation using polyvinyl butryal as binder, cyclohexanone as solvent and fish oil as dispersant.

11. A process as claimed in claim 1, wherein the intervening material used is a paste of partially preformed superconducting powder in air-drying silver paint.

* * * * *